United States Patent
Kelkar et al.

(10) Patent No.: US 7,095,116 B1
(45) Date of Patent: Aug. 22, 2006

(54) ALUMINUM-FREE UNDER BUMP METALLIZATION STRUCTURE

(75) Inventors: Nikhil V. Kelkar, San Jose, CA (US); Viraj A. Patwardhan, Sunnyvale, CA (US); King Tong Lim, Melaka (MY); A. Tharumalingam Sri Ganesh, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 195 days.

(21) Appl. No.: 10/726,042

(22) Filed: Dec. 1, 2003

(51) Int. Cl.
*H01L 21/44* (2006.01)

(52) U.S. Cl. .................. 257/737; 257/678; 257/738
(58) Field of Classification Search ............... 257/737
See application file for complete search history.

(56) References Cited

U.S. PATENT DOCUMENTS

| | | | |
|---|---|---|---|
| 6,249,044 B1 * | 6/2001 | Kao et al. ............... | 257/678 |
| 6,258,705 B1 * | 7/2001 | Chien et al. ............. | 438/614 |
| 6,327,158 B1 | 12/2001 | Kelkar et al. ........... | 361/779 |
| 6,452,270 B1 * | 9/2002 | Huang .................... | 257/738 |
| 6,462,426 B1 | 10/2002 | Kelkar et al. ........... | 257/781 |
| 6,468,892 B1 | 10/2002 | Baker et al. ............ | 438/612 |
| 6,512,298 B1 * | 1/2003 | Sahara et al. ........... | 257/773 |
| 2002/0121692 A1 * | 9/2002 | Lee et al. ................ | 257/737 |
| 2003/0116845 A1 * | 6/2003 | Bojkov et al. .......... | 257/738 |

* cited by examiner

*Primary Examiner*—Andy Huynh
*Assistant Examiner*—Dao H. Nguyen
(74) *Attorney, Agent, or Firm*—Beyer Weaver & Thomas, LLP

(57) ABSTRACT

An apparatus and method for providing aluminum free under bump metallization stacks in an integrated circuit device is disclosed. Included is the use of vias having substantially non-vertical sidewalls that are formed in a resilient layer, such as benzocyclobutene. In general, semiconductor wafers having a plurality of dice are created, with each die having a plurality of contact pads that are formed on the active surface of the wafer. One or more passivation layers are formed on the active surface and etched appropriately to form vias coupled to the contact pads. At least one resilient layer is then disposed atop the top passivation layer and etched appropriately to form vias aligned with and smaller than the passivation layer vias, such that at least part of the contact pads but no part of the passivation layer is exposed. A plurality of UBM stacks are then formed atop the exposed contact pads and resilient layer, with each UBM stack having a plurality of layers, none of which are aluminum layers. Solder bumps are then formed atop each UBM stack.

18 Claims, 4 Drawing Sheets

ALUMINUM-FREE UNDER BUMP METALLIZATION STRUCTURE

TECHNICAL FIELD

The present invention relates generally to the packaging of integrated circuit devices, and more specifically to an improved under bump metallization stack.

BACKGROUND

Numerous conventional packages for integrated circuit ("IC") devices involve the formation of solder bumps or other suitable contacts onto associated I/O contact pads formed on an active face of a die. The die is then typically attached to a suitable substrate, such as a printed circuit board ("PCB"), such that the solder bumps on the die are surface mounted to contact pads on the substrate. The solder bumps are then typically reflowed to form solder joint connections between the substrate and the attached die. Such a surface mount device ("SMD") is often referred to as "flip chip," since the chip or die must be "flipped" to place its active surface containing solder bumps into contact with the substrate to which the chip is to be attached.

Many problems associated with connecting a solder bump to a contact pad, such as issues with wetting, adhesion, temperature cycling induced stresses, and the electrical isolation needs, among others, are solved by providing additional items between the solder bump and the contact pad. Such items can include, for example, passivation layers, resilient layers and under bump metallization ("UBM") stacks, among others. For purposes of efficiency, these items are all typically formed onto dice at the wafer level prior to separation, with such formation processes being generally known to those skilled in the art. Contact pads are usually formed first onto an active surface of a wafer, with one or more passivation and/or resilient layers having individual vias corresponding to individual contact pads coming next. UBM stacks having a multiple layers are formed above and typically through the vias, such that the bottom layer of each UBM stack contacts a contact pad or an electrical connector to a contact pad. A common UBM stack formation includes a bottom layer of aluminum for adhering to a contact pad, a top layer of copper for wetting to a solder bump, and a middle layer of nickel-vanadium or other suitable metal or alloy for adhering copper to aluminum.

Although the provision of UBM stacks solves many problems associated with connecting solder bumps to contact pads, other problems are introduced through their use. For example, a typical UBM stack is commonly formed by conventional sputtering and etching processes such that the end portion of each layer is exposed at the vertical edges of the UBM stack. Although an underfill layer may provide some protection, many SMDs now forgo the use of underfill layers, rendering their UBM stack edges as permanently exposed. For aluminum in particular, these exposed stack edges can experience corrosion and lead to eventual failure whenever moisture or other contaminants are introduced. Contamination may occur, for example, due to contact with a poorly formed solder paste or the inadequate cleaning of an associated pressure chamber having undesirable residues. In addition, the use of conventionally sputtered and etched layers frequently results in sharp edges, which can exacerbate stresses due to temperature cycling in any layer placed directly atop a sharp edge.

Although existing UBM structures work well in many situations, there are thus ongoing efforts to further improve the UBM structures used in various integrated circuit devices such that problems like those give above are minimized or eliminated.

SUMMARY

It is an advantage of the present invention to provide improved UBM stacks and associated structures that are more resistant to corrosion and less prone to failure due to temperature cycling induced stresses and/or exposure to moisture and other outside contaminants. According to one embodiment of the present invention, the provided apparatus contains electrical connections of contact pads, UBM stacks, and solder bumps that have no exposed aluminum. This is preferably accomplished by eliminating aluminum as a component from the UBM stacks.

In addition, a reduction in any temperature cycling induced stresses is accomplished by forming vias having tapered sidewalls in a resilient layer, such that each of the successive layers of a UBM stack formed thereupon are not exposed to sharp edges in the layer immediately beneath them. Such a result can be accomplished by enlarging the size of the vias through an underlying passivation layer so that each is larger than an associated via formed within a resilient layer formed thereupon.

Other apparatuses, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The included drawings are for illustrative purposes and serve only to provide examples of possible structures for the disclosed inventive apparatus and method for providing improved UBM stacks. These drawings in no way limit any changes in form and detail that may be made to the invention by one skilled in the art without departing from the spirit and scope of the invention.

DETAILED DESCRIPTION

Exemplary applications of apparatuses and methods according to the present invention are described in this section. These examples are being provided solely to add context and aid in the understanding of the invention. It will thus be apparent to one skilled in the art that the present invention may be practiced without some or all of these specific details. In other instances, well known process steps have not been described in detail in order to avoid unnecessarily obscuring the present invention. Other applications are possible, such that the following examples should not be taken as limiting.

In the following detailed description, references are made to the accompanying drawings, which form a part of the description and in which are shown, by way of illustration, specific embodiments of the present invention. Although these embodiments are described in sufficient detail to enable one skilled in the art to practice the invention, it is understood that these examples are not limiting; such that other embodiments may be used, and changes may be made without departing from the spirit and scope of the invention. For example, although the present invention is primarily described herein as being implemented in flip chip type packages, it should be understood that the present invention may be implemented in any IC package having contact bumps.

Various advantages that may result from some embodiments of the present invention can include a reduction in moisture or contaminant induced corrosion in a UBM stacks, a reduction of temperature cycling induced stresses in UBM stacks and solder bumps, and/or an inherent increase in manufacturing efficiency resulting from the elimination of all aluminum layers from UBM stacks, among others.

Figure 1A:
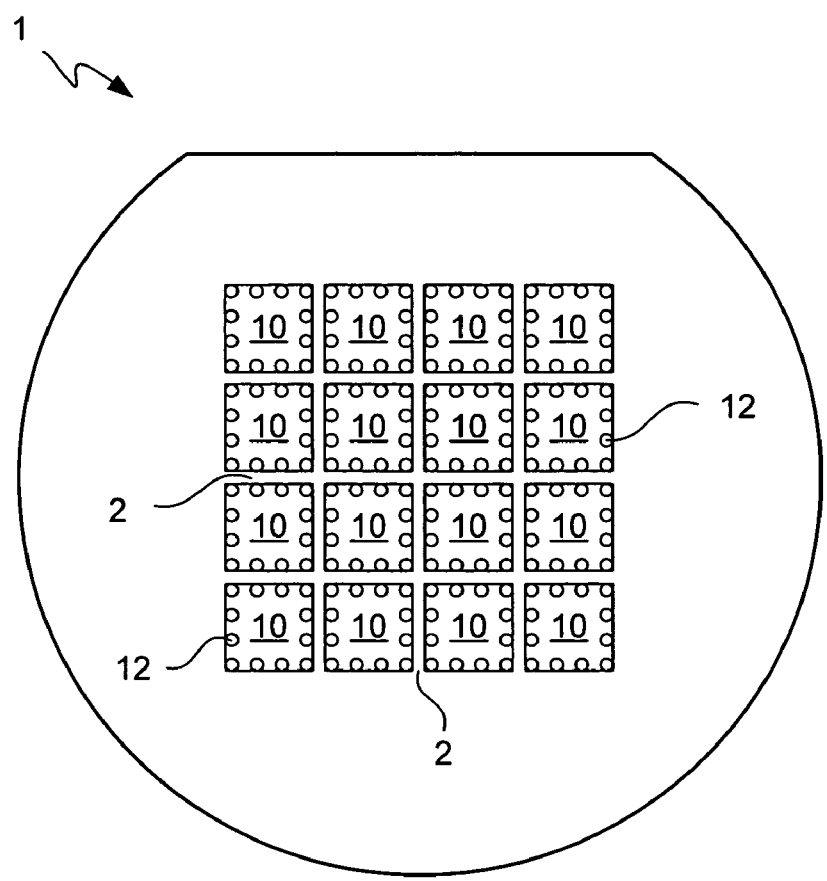
FIG. 1A illustrates in top plan view an exemplary wafer comprising multiple surface mount semiconductor dice.

Referring first to FIG. 1A, an exemplary wafer comprising multiple surface mount semiconductor dice is illustrated in top plan view. Wafer 1 includes a plurality of dice 10 separated by horizontal and vertical scribe lines 2. Each of the dice 10 includes a plurality of solder contacts 12, which can be mounted to contact pads of a substrate such as a PCB. It should be noted that while only a relatively small number of dice 10 are shown on the wafer 1 for purposes of illustration, most wafers have significantly more dice formed thereon. By way of example, current state of the art wafers typically have several hundred to several thousand dice formed thereon, and some have more than ten thousand dice. As is well known in the art, most wafers and dice are formed of silicon, although any other appropriate semiconductor material can also be used, including, for example, gallium arsenide (GaAs), Indium Gallium Phosphide, Silicon Germanium, and the like.

Figure 1B:
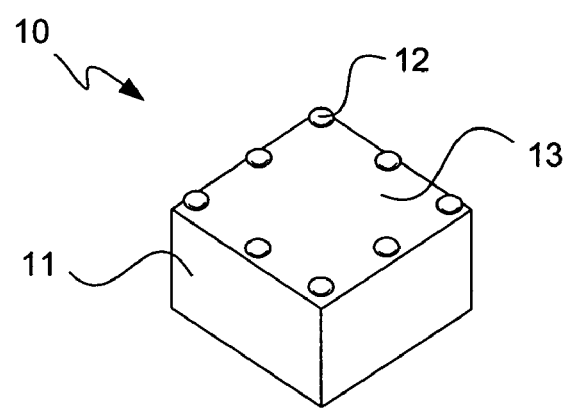
FIG. 1B illustrates in top perspective view a surface mount semiconductor die scribed from the wafer of FIG. 1A.

Referring now to FIG. 1B, one possible embodiment of an individual semiconductor die 10 scribed from the wafer of FIG. 1A is shown in top perspective view. After the wafer 1 is fabricated and solder contacts, "balls" or "bumps" 12 are formed thereon, a dicing machine is used to singulate the individual dice 10 by sawing or otherwise cutting the wafer 1 along the scribe lines 2. Each die 10 preferably has a body 11 and a plurality of solder bumps 12 formed on an active face 13. Also, although only one "row" or "ring" of solder bumps is provided on the die in the illustrated embodiment, other contact patterns including, for example, multiple rows, multiple rings, or arrays of contacts may also be provided as desired. In fact, it is common for solder bumps to be placed into adjacent rows and columns to form a grid or array. Any and all such shapes, dimensions, formations and patterns of solder contacts are contemplated for use with the present invention.

Figure 2A:
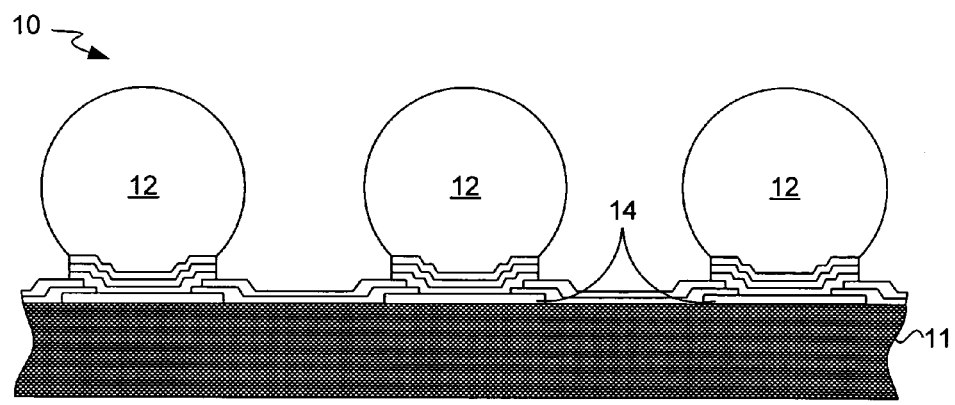
FIG. 2A illustrates in partial side cross-sectional view the semiconductor die of FIG. 1B before attachment to a substrate.
Figure 2B:
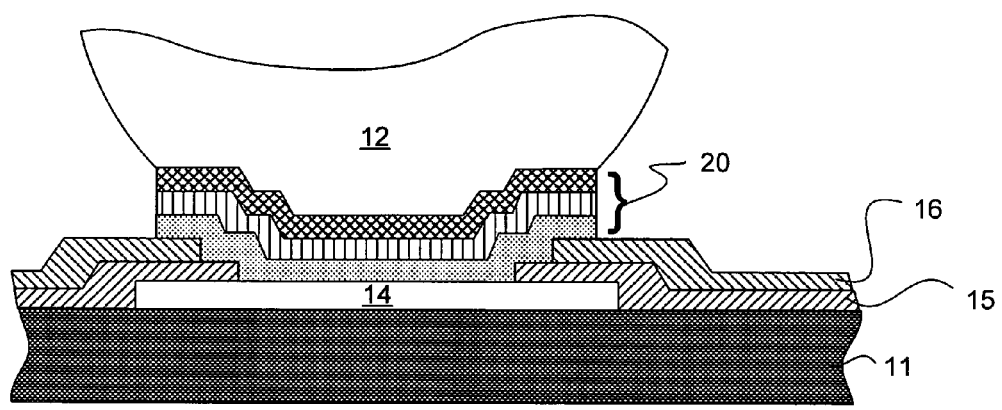
FIG. 2B illustrates in enlarged partial side cross-sectional view an isolated portion of the semiconductor die shown in FIG. 2A containing a single contact pad, UBM stack and solder bump.
Figure 2C:
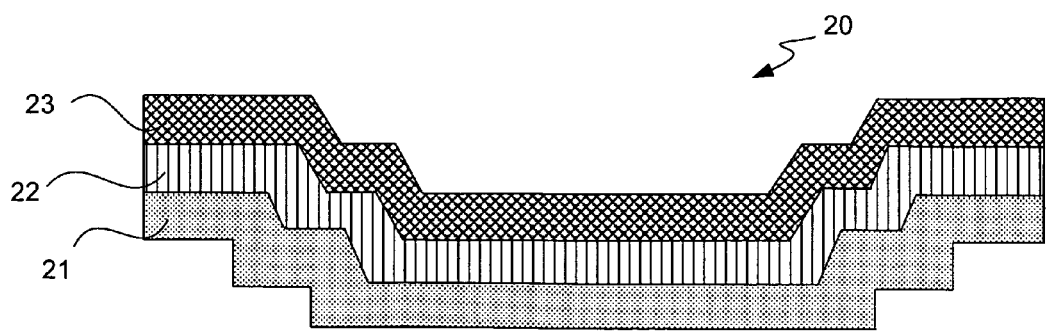
FIG. 2C illustrates in enlarged side cross-sectional view the single UBM stack shown in FIG. 2B.

Turning to FIGS. 2A through 2C, various parts of the semiconductor die of FIG. 1B are illustrated in several partial side cross-sectional views. It should be borne in mind that these and all other figures disclosed herein depict a die at a condition prior to attachment to a substrate, as changes such as solder bump collapse typically occur after such an attachment. In addition, the relative thicknesses of the dies, bumps and various layers in these figures are generally not to scale, but are merely representative. As shown in FIG. 2A, semiconductor die 10 is prepared in anticipation of forming solder joint connections with an associated substrate. A number of solder bumps 12 are formed above contact pads 14 and other associated structures located on the active face of the die while the die is still part of a wafer, as will be readily understood by those skilled in the art. One or more contact pads 14 are preferably coupled to at least one of the integrated circuit structures (not shown) within the semiconductor die body 11.

Continuing on to FIG. 2B, further description is given with respect to an isolated portion of the semiconductor die shown in FIG. 2A. Although only a single contact pad, UBM stack and solder bump are shown for purposes of illustration, it should be appreciated that any typical semiconductor die or wafer contains a plurality of each of these items. Contact pad 14 is typically formed atop the active surface of the die and can be of any shape desired, with circular, oval and square shapes being popular choices. Contact pad 14 is preferably formed from aluminum, due in part to its relatively favorable material properties and low cost, although other readily available metals or otherwise electrically conductive materials may also be used. It will be readily appreciated that the size of contact pad 14 may vary widely based on the needs of a particular application, and contact pad size has typically decreased over time with improving technologies. By way of example, in one particular application, the width of the contact pad 14 may be about 300 microns.

One or more passivation layers 15 are commonly formed over the exposed top surface of the semiconductor die and contact pads 14, whereupon openings or "vias" are then etched or otherwise created within any passivation layer above the contact pads 14 such that at least a portion of each contact pad remains exposed. As is generally known, a passivation layer primarily serves as a protective barrier for the semiconductor material, such that any passivation layer is preferably formed from an insulation type material such as silicon dioxide ($SiO_2$) or silicon nitride (SiN). One or more resilient protective layers 16 can then be formed over the exposed top surface of passivation layer 15, with vias similarly etched or otherwise created within any resilient layer above the contact pads 14, such that at least a portion of each contact pad still remains exposed. As is generally known, a resilient layer primarily serves as a stress buffer for absorbing thermal cycling induced stresses that may be introduced at the contact bump 12 and/or within UBM stack 20, such that any resilient layer is preferably formed from a sufficiently elastic type material such as, for example, a polyimide or benzocyclobutene ("BCB").

As seen in FIG. 2B, the vias in the resilient layer 16 are typically larger than the vias in the passivation layer 15, such that at least a portion of the passivation layer also remains exposed. It will be appreciated that these openings or vias may be formed in any shape desired, with circular vias being a popular design choice. Although the size of these vias may vary widely based on the needs of a particular application, by way of example, the width of the contact pads 14 in one particular embodiment can be about 300 microns. In such an instance, the width of the vias in passivation layer 15 may be, for example, about 230 microns, while the width of the vias in resilient layer 16 may be, for example, about 250 microns. Although it is generally preferable for corresponding vias to be substantially aligned, it is possible that the vias of resilient layer 16 may be positioned in locations other than directly aligned with the vias of passivation layer 15 in alternative arrangements not illustrated herein. For example, vias may be offset through the implementation of an intermediate electrically conductive layer, such as a redistribution layer, the formation and use of which will be readily appreciated by one skilled in the art.

With vias appropriately formed within each passivation layer 15 and resilient layer 16, a UBM stack 20 can then be formed atop contact pad 14, preferably through traditional sputtering and etching techniques. As is generally known, a UBM stack primarily serves as a protective barrier, adhesion vehicle and/or wetting enhancer between a contact pad and associated solder bump, such that a UBM stack preferably contains multiple layers of varying metallic compositions. UBM stack 20 is formed such that it is in direct contact with at least a portion of the top surface of contact pad 14, although direct contact with a redistribution layer contact (not shown) may be substituted for direct contact with a contact pad in some cases. In addition, UBM stack 20 is formed such that a solder bump 12 can be properly formed atop and adhered to an upper surface of the UBM stack, resulting in a solder bump that is thereby electrically coupled to the contact pad 14. As shown in FIG. 2B, UBM stack 20 is preferably wide enough such that it covers at least some portion of both passivation layer 15 and resilient layer 16, resulting in a formation that is somewhat bowl-shaped rather than flat. UBM stack 20 can also be formed such that its transverse cross-sectional area is of any shape desired, such as circular, oval or square, although a circular shape is preferable.

Continuing on to FIG. 2C, further description is given with respect to the single UBM stack shown in FIG. 2B. UBM stack 20 is essentially a three layer sandwich containing three distinct metal layers, with an aluminum (Al) layer 21 being at the bottom of the stack, a nickel-vanadium (NiV) layer 22 being directly atop the aluminum layer, and a copper (Cu) layer 23 being at the top of the stack and directly atop the nickel-vanadium layer. Such a bottom to top Al—NiV—Cu metallic layer combination is a popular one for use in UBM stacks. In general, the bottom Al layer 21 is ideal for adhering to an aluminum contact pad, the top Cu layer 23 is very favorable for adhering to and enhancing wetting with a typical lead or tin based solder bump, and the middle NiV layer 22 is a very favorable barrier layer for discouraging corrosion, as well as for adhering the Al layer to the Cu layer.

It will be readily appreciated that the thicknesses of these various UBM stack layers may vary widely based on the formation processes used and the needs of a particular application. By way of example, in a representative application where the width of the contact pad is about 300 microns, an exemplary formation of UBM stack layers may result in Cu layers with a thickness of about 8 kilo-angstroms, NiV layers with a thickness of about 3–4 kilo-angstroms, and Al layers with a thickness of about 4–10 kilo-angstroms. Hence, the overall UBM stack thickness for such an exemplary bottom to top Al—NiV—Cu UBM stack can be on the order of about 15–22 kilo-angstroms. Although Al—NiV—Cu is a popular UBM stack formation, various other metals and alloys can also be used in the formation of UBM stacks. For example, metals and alloys such as gold (Au), titanium (Ti), chromium (Cr) and chromium-copper (CrCu) can be used to form other metallic layer bottom to top combinations, such as, for example, Al—NiV—Cu—Au; Al—Ni—Cu; Ti—Ni—Au; Ti—Cu; Cr—CrCu—Cu; and Al—Ni, among others.

As will be readily understood by those skilled in the art, each of the foregoing layers and features can be formed using any of a number of conventional fabrication techniques. For example, the patterned layers can be formed using well-known photolithography techniques, while each of the UBM stack layers can be formed using well-known electroplating processes. After all of these and any other wafer level fabrication processes are completed, the wafer can then be singulated into a plurality of individual semiconductor dice, whereupon each individual die may then be attached to an external substrate, such as a PCB. Additionally, although alternative UBM stacks that include the use of metals such as gold, titanium and chromium may have some properties that are better than those of a typical Al—NiV—Cu stack, the use of such other metals can be significantly more expensive and thus not cost effective in many instances. Conversely, as disclosed previously, various drawbacks in the use of aluminum can occur whenever any aluminum is exposed at an ambient edge or surface.

Figure 3A:
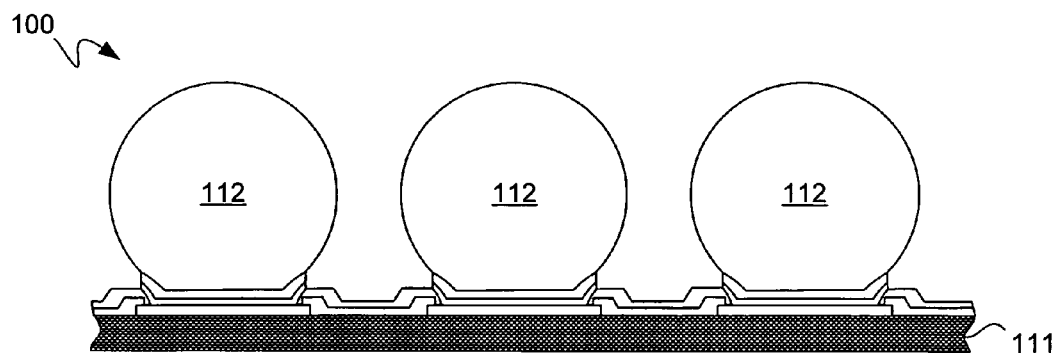
FIG. 3A illustrates in partial side cross-sectional view a semiconductor die having a plurality of aluminum-free UBM stacks according to one embodiment of the present invention.

Turning now to FIGS. 3A through 3E, an alternative semiconductor die having multiple aluminum-free UBM stacks according to one embodiment of the present invention is illustrated in several partial side cross-sectional views and one partially cut away top plan view. Referring first to FIG. 3A, semiconductor die 100 is prepared in anticipation of forming solder joint connections with an associated substrate. As in the previous embodiment, a number of solder bumps 112 are formed above contact pads and other associated structures located on the active face of the die while the die is still part of a wafer, as will be readily understood by those skilled in the art. Also similar to the previous embodiment, one or more contact pads are preferably coupled to at least one of the integrated circuit structures (not shown) within the semiconductor die body 111.

Figure 3B:
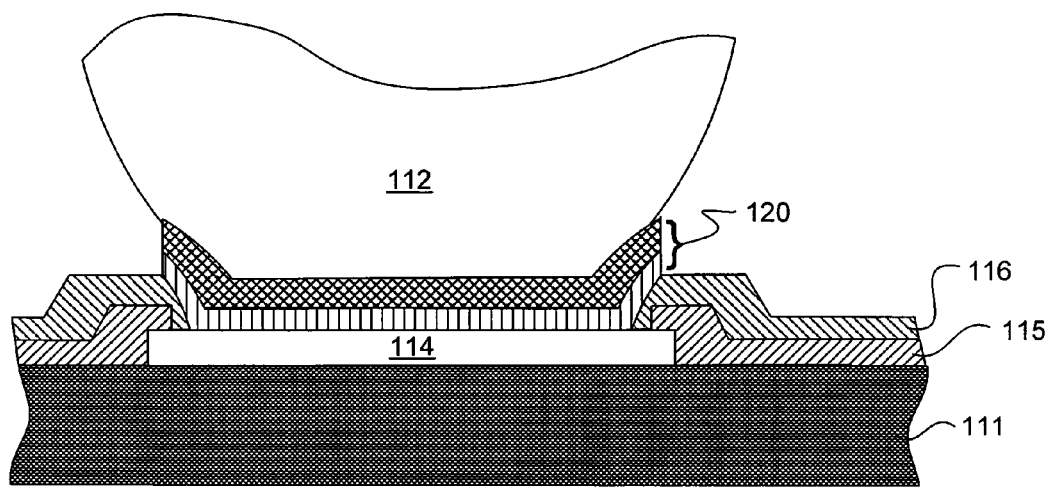
FIG. 3B illustrates in enlarged partial side cross-sectional view an isolated portion of the semiconductor die shown in FIG. 3A containing a single contact pad, UBM stack and solder bump according to one embodiment of the present invention.

Continuing on to FIG. 3B, further detailed description is provided with respect to an isolated portion of the semiconductor die shown in FIG. 2A. Although only a single contact pad, UBM stack and solder bump are shown for purposes of illustration, it should be appreciated that any typical semiconductor die or wafer contains a plurality of each of these items. Contact pad 114 is typically formed atop the active surface of the die and can be of any shape desired, with circular, oval and square shapes being popular choices. For purposes of illustration herein, contact pad 114 is substantially square. As in the foregoing embodiment, contact pad 114 is preferably formed from aluminum, although other readily available metals or otherwise electrically conductive materials may also be used. Although the size of contact pad 114 may vary widely as desired, by way of example, in one particular application, the width of contact pad 114 may be about 300 microns.

As in the foregoing embodiment, at least one passivation layer 115, such as, for example, a $SiO_2$ or SiN layer, is formed over the exposed top surface of the semiconductor die and contact pads 114, whereupon vias are then etched or otherwise created within the passivation layer above the contact pads such that at least a portion of each contact pad remains exposed. At least one resilient protective layer 116, such as, for example BCB or polyimide layer, is then formed over the exposed top surface of passivation layer 115 and contact pads 114, with vias similarly etched or otherwise created therein above the contact pads such that at least a portion of each contact pad still remains exposed. Again, it will be appreciated that these vias may be formed in any shape desired, with substantially circular vias being a popular design choice. Although it is similarly preferable for corresponding vias to be substantially aligned, it is possible for the vias of resilient layer 116 to be positioned in locations other than directly aligned with the vias of passivation layer 115 in alternative arrangements.

Unlike the previous embodiment, however, and as illustrated in FIG. 3B, the vias in resilient layer 116 are smaller than the vias in the passivation layer 115, such that at least a portion of the resilient layer directly overlies at least a portion the contact pads and renders none of the passivation layer as exposed. In addition, the sidewalls of the vias in resilient layer 116 are not substantially vertical, but rather are generally rounded and/or tapered at an angle with respect to a horizontal plane defined by the resilient layer, such that no sharp corners are formed where the vias begin at the upper surface of the resilient layer. Although the formation of vias with tapered sidewalls and no sharp corners might be difficult using conventional process techniques with passivation layer materials such as $SiO_2$ and SiN, such vias can be readily formed in a resilient layer material such as BCB. For example, a conventional photolithography process used upon a BCB layer can result in the formation of vias having tapered sidewalls and no sharp corners at an upper edge of the BCB layer. The tapered angle of the sidewalls can be made to vary as desired, and by way of example it has been observed that an angle of about 45 degrees with respect to a horizontal plane defined by the resilient layer works well.

With vias appropriately formed within passivation layer 115 and resilient layer 116, a UBM stack 120 can then be formed atop contact pad 114, preferably through traditional sputtering and etching techniques. As in the foregoing embodiment, UBM stack 120 is preferably formed such that it is in direct contact with at least a portion of the top surface of contact pad 114, although direct contact with a redistribution layer contact (not shown) may be substituted for direct contact with a contact pad. In addition, UBM stack 120 is formed such that a solder bump 112 can be properly formed atop and adhered to an upper surface of the UBM stack, resulting in a solder bump that is thereby electrically coupled to the contact pad 114. As shown in FIG. 3B, UBM stack 120 is preferably wide enough such that it directly covers at least some portion of resilient layer 116, resulting in a formation that is somewhat bowl-shaped rather than flat. UBM stack 120 can also be formed such that its transverse cross-sectional area is of any shape desired, such as circular, oval or square, although a circular shape is preferable.

Figure 3C:
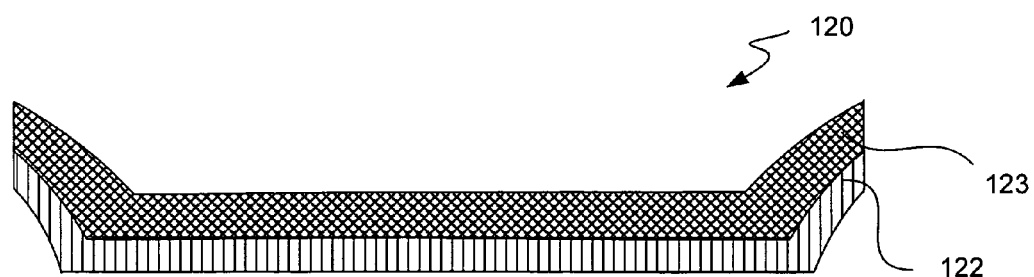
FIG. 3C illustrates in enlarged side cross-sectional view the single UBM stack shown in FIG. 3B according to one embodiment of the present invention.

Continuing on to FIG. 3C, further description is given with respect to the single UBM stack shown in FIG. 3B. UBM stack 120 is essentially a two layer stack containing only two distinct metal layers, with a nickel-vanadium (NiV) layer 122 being at the bottom of the stack and a copper (Cu) layer 123 being at the top of the stack and directly atop the nickel-vanadium layer. Such a bottom to top NiV—Cu metallic layer combination specifically excludes an aluminum layer, as well as any other layer having a relatively expensive metal or alloy, such as gold, titanium or chromium. As in the case of the foregoing embodiment, the top Cu layer 123 is still very favorable for adhering to and enhancing wetting with a typical lead or tin based solder bump, and the now bottom NiV layer 122 is a very favorable barrier layer for discouraging corrosion, as well as for adhering an aluminum contact pad to the top Cu layer 123. While the bottom NiV layer 122 is not as ideal as an aluminum layer for adhering to an aluminum contact pad, such a NiV layer has been found to be substantially serviceable in this regard.

The end result is an aluminum-free UBM stack that is free of the corrosive drawbacks of a UBM stack having an aluminum layer, yet does not require the use of any relatively expensive metals or alloys. In addition, the overall thickness of UBM stack 120 is significantly reduced with respect to the UBM stack 20 of the previous embodiment. Because the formation of stack layers results in Cu layers with a thickness of about 8 kilo-angstroms and NiV layers with a thickness of about 3–4 kilo-angstroms, as discussed above, the overall UBM stack thickness for a bottom to top NiV—Cu stack is significantly less than the typical minimum of 15 kilo-angstroms in UBM stack 20 of the previous embodiment. In fact, the overall thickness of a NiV—Cu UBM stack tends to be on the order of about 11–12 kilo-angstroms.

Figure 3D:
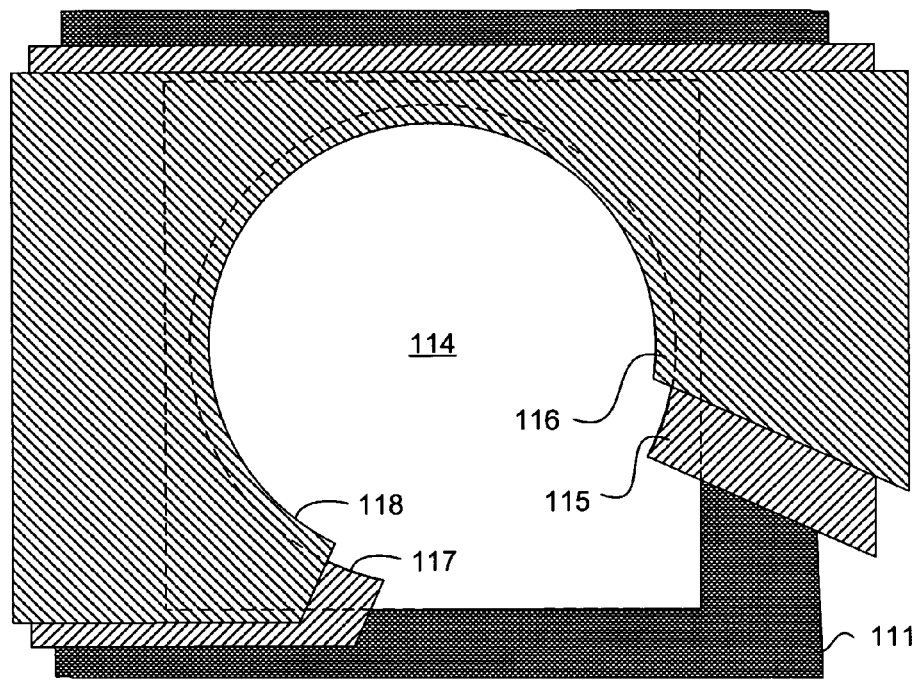
FIG. 3D illustrates in partially cut-away top plan view the portion of semiconductor die shown in FIG. 3B containing a single contact pad, passivation layer and resilient layer according to one embodiment of the present invention.

Continuing on to FIG. 3D, the isolated portion of semiconductor die shown in FIG. 3B without the UBM stack or solder bump is illustrated in partially cut-away top plan view. As mentioned above, contact pad 114 is substantially square, although other shapes are also contemplated. A passivation layer 115 defining a substantially horizontal plane is formed first atop the die body 111 and contact pad 114. A via exposing at least a portion of the contact pad 114 and defining a via perimeter 117 establishing sidewalls substantially perpendicular to the passivation layer plane is then formed in the passivation layer 115. A resilient layer 116 defining a substantially horizontal plane is then formed atop the passivation layer 115 and contact pad 114, and a via exposing a portion of the contact pad but none of the passivation layer is formed in this resilient layer. As discussed above, this resilient layer via defines a perimeter 118 that establishes sidewalls that are not substantially perpendicular to the resilient layer plane, but are instead tapered at some non-perpendicular angle with respect to the resilient layer plane.

Figure 3E:
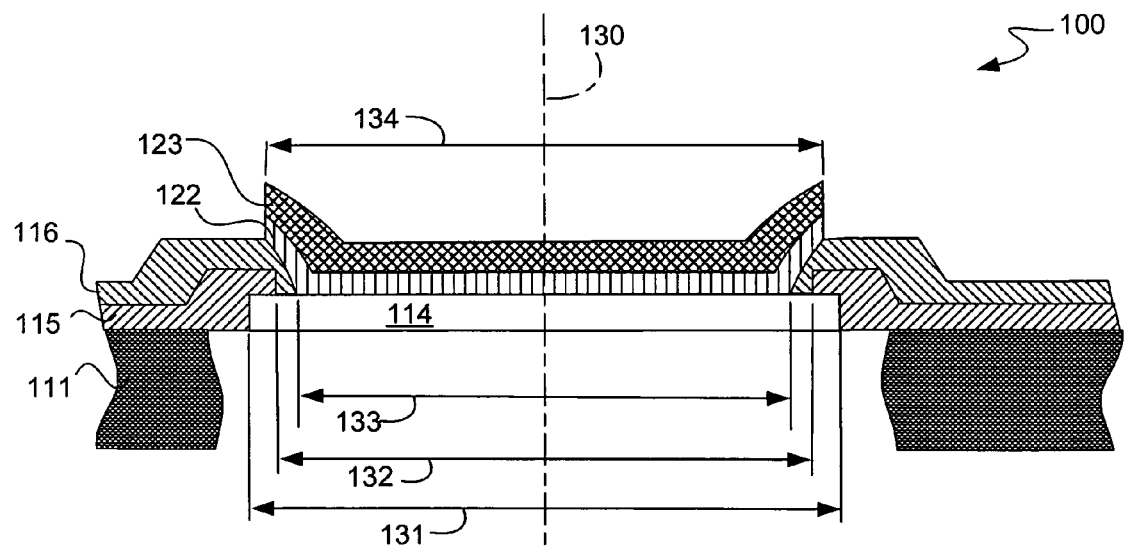
FIG. 3E illustrates in enlarged partial side cross-sectional view a portion of the semiconductor die, single contact pad and UBM stack shown in FIG. 3B according to one embodiment of the present invention.

Continuing with FIG. 3E, the isolated portion of the semiconductor die in FIG. 3B without the solder bump is shown. While passivation layer 115 and resilient layer 116 both define substantially horizontal planes, as discussed above, each of the contact pad 114, corresponding via in passivation layer 115, corresponding via in resilient layer 116, NiV layer 122 and Cu layer 123 defines a corresponding primary vertical axis 130. Accordingly, the tapered sidewalls of the resilient layer via are not substantially parallel to this primary vertical axis 130, as illustrated and discussed above. Although the size of the contact pad and various vias and UBM stack layers may vary widely based on the needs of a particular application, by way of example, the width 131 of the contact pads 114 in one particular embodiment can be about 300 microns. In such an instance, the passivation layer via width 132 may be, for example, about 270 microns, while the resilient layer via width 133 may be, for example, about 250 microns. In addition, the UBM stack width 134 may be, for example, about 280 microns. It has been found that use of such an alternative semiconductor die with the above measurements having no aluminum UBM stack layer and tapered sidewalls in its resilient layer vias results in more reliable solder joint connections having longer lifetimes.

In addition, these benefits of improved reliability and increased lifetime are advantageously achieved without the need for any additional process steps, and can be made to require only an increase in the size of the vias in the passivation layer while keeping the resilient layer via size as substantially the same. Any implementation of such a difference in passivation layer via size would require only a one-time process design adjustment for existing systems and a new design specification for new systems, neither of which involve a significant expense. In fact, because several process steps are eliminated by way of eliminating all aluminum UBM stack layers, these improvements in solder joint reliability and lifetime can advantageously be obtained at an overall reduced cost.

Although the foregoing invention has been described in detail by way of illustration and example for purposes of clarity and understanding, it will be recognized that the above described invention may be embodied in numerous other specific variations and embodiments without departing from the spirit or essential characteristics of the invention. For example, while a barrier layer of nickel-vanadium and a wetting layer of copper have been disclosed as exemplary layers for a relatively inexpensive aluminum-free UBM stack, other inexpensive metals and alloys may also be adapted for use in such layers. Certain changes and modifications may be practiced, and it is understood that the invention is not to be limited by the foregoing details, but rather is to be defined by the scope of the appended claims.

What is claimed is:

1. A semiconductor wafer having an active surface, comprising:
    a plurality of dice, each die having a plurality of contact pads formed on the active surface of the wafer;
    a passivation layer disposed on said active surface, said passivation layer having a plurality of passivation layer vias formed therethrough and associated with at least a portion of said plurality of contact pads;
    a resilient layer disposed on said passivation layer, said resilient layer having a plurality of resilient layer vias formed therethrough, wherein all sidewalls of at least some of said plurality of resilient layer vias are fully tapered from the top to the bottom of said resilient layer at substantially non-vertical angle relative to the active surface of said wafer, and wherein at least a portion of said plurality of passivation layer vias define a perimeter that completely encloses the perimeter of a corresponding resilient layer via;
    a plurality of under bump metallization stacks, each under bump metallization stack including a nickel-vanadium layer and a copper layer, wherein the nickel-vanadium layer is directly atop and in substantial contact with an associated contact pad and the copper layer is directly atop and in substantial contact with the nickel-vanadium layer, said under bump metallization stack being arranged such that at least some portion of the under bump metallization stack overlies a portion of said resilient layer; and
    a plurality of solder bumps, each solder bump being formed on an associated under bump metallization stack.

2. The semiconductor wafer of claim 1, wherein said resilient layer comprises benzocyclobutene or a polymide.

3. The semiconductor wafer of claim 1, wherein one or more of said plurality of under bump metallization stacks has a total thickness of less than about 15 kilo-angstroms.

4. The semiconductor wafer of claim 3, wherein one or more of said plurality of under bump metallization stacks has a total thickness of less than about 12 kilo-angstroms.

5. The semiconductor wafer of claim 1, wherein said passivation layer comprises a compound selected from the group consisting of silicon dioxide and silicon nitride.

6. The semiconductor wafer of claim 1, wherein said fully tapered sidewalls are tapered at an angle of about 45 degrees with respect to said active surface of said wafer.

7. An integrated circuit device, comprising:
    a plurality of contact pads formed on a first surface of said device;
    a passivation layer disposed on said first surface, said passivation layer including a plurality of passivation layer vias formed therethrough and associated with at least a portion of said plurality of contact pads;
    a resilient layer defining a substantially horizontal plane and disposed on said passivation layer, said resilient layer having a plurality of resilient layer vias formed therethrough and associated with at least a portion of said plurality of contact pads and at least a portion of said plurality of passivation layer vias, wherein one or more of said plurality of resilient layer vias
        defines a primary axis extending therethrough and perpendicular to said substantially horizontal plane, and
        contains one or more sidewalls that are fully tapered from ton to bottom such that no portion of sidewall is substantially parallel to said primary axis; and
    a plurality of under bump metallization stacks, wherein one or more of said plurality of under bump metallization stacks each couple with an associated contact pad, and wherein each such under bump metallization stack comprises a plurality of metal or alloy layers, none of which are an aluminum layer, a titanium layer or a chromium layer,
        wherein one or more of said plurality of passivation layer vias each define a perimeter that completely encloses the perimeter of a corresponding resilient layer via, such that an associated under bump metallization stack contacts said resilient layer but does not contact said passivation layer.

8. The integrated circuit device of claim 7, wherein at least a portion of said plurality of under bump metallization stacks each comprise at least one layer selected from the group consisting of copper and nickel-vanadium.

9. The integrated circuit device of claim 8, wherein at least a portion of said plurality of under bump metallization stacks each comprise a copper layer directly atop and in substantial contact with a nickel-vanadium layer, which is in turn directly atop and in substantial contact with an associated contact pad.

10. The integrated circuit device of claim 7, wherein one or more of said plurality of under bump metallization stacks has a total thickness of less than about 15 kilo-angstroms.

11. The integrated circuit device of claim 7, further comprising:
    a plurality of solder bumps, wherein one or more of said plurality of solder bumps are each coupled with an associated under bump metallization stack and an associated contact pad.

12. The integrated circuit device of claim 7, wherein said resilient layer completely covers all top and side surfaces of said passivation layer at at least a portion of said plurality of passivation layer vias.

13. The integrated circuit device of claim 7, wherein said passivation layer comprises a silicon based material.

14. The integrated circuit device of claim 13, where said passivation layer comprises one or more materials selected from the group consisting of $SiO_2$ and SiN.

15. The integrated circuit device of claim 7, wherein said resilient layer comprises benzocyclobutene or a polyimide.

16. The integrated circuit device of claim 7, wherein said fully tapered sidewalls are tapered at an angle of about 45 degrees with respect to said substantially horizontal plane.

17. An integrated circuit device, comprising:
- a plurality of contact pads formed on an active surface of said device;
- an inorganic passivation layer disposed upon said active surface, said passivation layer including a plurality of passivation layer vias formed therethrough and associated with at least a portion of said plurality of contact pads;
- a polymeric resilient layer defining a substantially horizontal plane and disposed upon and substantially covering said passivation layer, said resilient layer having a plurality of resilient layer vias formed therethrough and associated with at least a portion of said plurality of contact pads and at least a portion of said plurality of passivation layer vias, wherein one or more of said plurality of resilient layer vias defines a primary axis extending therethrough and perpendicular to said substantially horizontal plane, and contains one or more sidewalls that are fully tapered from top to bottom such that no portion of sidewalls is substantially parallel to said primary axis;
- a plurality of under bump metallization stacks, wherein one or more of said plurality of under bump metallization stacks each couple with an associated contact pad, and wherein each such under bump metallization stack comprises a plurality of metal or alloy layers, none of which are an aluminum layer, a titanium layer or a chromium layer, and wherein one or more of said plurality of passivation layer vias each define a perimeter that completely encloses the perimeter of a corresponding resilient layer via, such that an associated under bump metallization stack contacts said resilient layer but does not contact said passivation layer; and
- a plurality of solder bumps, wherein one or more of said plurality of solder bumps are each coupled with an associated under bump metallization stack and an associated contact pad,
    wherein one or more of said plurality of passivation layer vias each define a perimeter that completely encloses the perimeter of a corresponding resilient layer via, such that an associated under bump metallization stack contacts said resilient layer but does not contact said passivation layer.

18. The integrated circuit device of claim 17, wherein said fully tapered sidewalls are tapered at an angle of about 45 degrees with respect to said substantially horizontal plane.

* * * * *

UNITED STATES PATENT AND TRADEMARK OFFICE
CERTIFICATE OF CORRECTION

PATENT NO. : 7,095,116 B1 Page 1 of 1
APPLICATION NO. : 10/726042
DATED : August 22, 2006
INVENTOR(S) : Kelkar et al.

It is certified that error appears in the above-identified patent and that said Letters Patent is hereby corrected as shown below:

In line 19 of claim 7 (column 10, line 33) change "ton to bottom" to --top to bottom--.

In line 1 of claim 14 (column 11, line 7) change "where said" to --wherein said--.

Signed and Sealed this

Twenty-fourth Day of April, 2007

JON W. DUDAS
*Director of the United States Patent and Trademark Office*